United States Patent
Mangattur et al.

(10) Patent No.: US 8,618,834 B2
(45) Date of Patent: Dec. 31, 2013

(54) METHOD AND APPARATUS FOR CONFIGURING AN INTEGRATED CIRCUIT

(75) Inventors: Jason J. Mangattur, Thornhill (CA); Richard Fung, Thornhill (CA); Alan Siu Kei Poon, North York (CA)

(73) Assignee: ATI Technologies ULC, Markham, Ontario, CA (US)

( * ) Notice: Subject to any disclaimer, the term of this patent is extended or adjusted under 35 U.S.C. 154(b) by 0 days.

(21) Appl. No.: 13/332,982

(22) Filed: Dec. 21, 2011

(65) Prior Publication Data

US 2013/0162289 A1  Jun. 27, 2013

(51) Int. Cl.
*H03K 19/173* (2006.01)
(52) U.S. Cl.
USPC .......................................................... 326/38
(58) Field of Classification Search
USPC ........................................ 326/37–41, 47, 101
See application file for complete search history.

(56) References Cited

U.S. PATENT DOCUMENTS

| | | | |
|---|---|---|---|
| 7,259,591 B1* | 8/2007 | Brown | 326/82 |
| 2002/0027233 A1* | 3/2002 | Yamaki et al. | 257/200 |
| 2011/0018507 A1* | 1/2011 | Mccloy-Stevens et al. | 323/271 |
| 2011/0018515 A1* | 1/2011 | McCloy-Stevens | 323/284 |
| 2012/0001785 A1* | 1/2012 | Nagata et al. | 341/152 |

* cited by examiner

*Primary Examiner* — Thienvu Tran
(74) *Attorney, Agent, or Firm* — Faegre Baker Daniels LLP (57) ABSTRACT

A method and apparatus configures an integrated circuit by determining a multi-bit configuration value on a single node. The multi-bit configuration value is determined by using at least a voltage level at the single node and also by detecting a time to reach a voltage threshold level at the single node, based on a voltage ramp generation circuit. The method and apparatus also includes configuring an operation mode of a circuit in the integrated circuit based on the determined multi-bit configuration value from the single node. Multi-bit configuration values may be obtained on multiple single nodes in an integrated circuit. In one example, a voltage level is employed in addition to a time to reach a voltage threshold level whereas in another example a current level on a single node is utilized in combination with detection of a time to reach a voltage threshold level.

20 Claims, 9 Drawing Sheets

METHOD AND APPARATUS FOR CONFIGURING AN INTEGRATED CIRCUIT

BACKGROUND OF THE DISCLOSURE

The disclosure relates generally to methods and apparatus for configuring an integrated circuit and more specifically to methods and apparatus that use input/output pads or other pins of an integrated circuit for circuit or process configuration purposes.

Complex integrated circuits such as central processing units, graphics processing units, application specific integrated circuits (ASICs), digital signal processors and other integrated circuits often need to power up in a specific state depending on the application that the integrated circuit is being used in. Traditionally these integrated circuits have input/output (I/O) pads used for configuration purposes, where for example external tie-high or tie-low resistors are used on conductive pads to force core logic in an input logic state to be either a logic "1" or logic "0" so that during a chip reset condition the chip may be configured in a specific manner to configure the internal state of a circuit within the integrated circuit. Low speed general purpose input/output pins are typically used for this purpose. This type of I/O pad is sometimes referred to as a strap pad. The configuration information received from the strap pad is required before the integrated circuit comes out of reset such as before a BIOS can read in. General purpose ports can be used as strap pads before reset and can be used for other input/output signals after reset mode.

A problem arises in that the restrictions on the input/output pins during reset is such that the pins can tolerate being strapped high or low and nothing attached to the signals can overwrite the external tie-high or tie-low resistors which limits the use of the I/O pad during normal operation. For example, if an external pull up resistor or pull down resistor is connected to an I/O pin for purposes of the configuration logic, this still impacts the normal operating mode of the input/output pin since it has external resistors tied to it. Another problem is that the number of straps the integrated circuit can use is limited by the number of GPIOs required by the integrated circuit. Typically, one strap pad provides one configuration bit. If more strap pads are required, additional silicon area, packaging area and printed circuit board area could be wasted in order to accommodate the additional straps. To program an integrated circuit for configuration purposes, one input/output pin is used for one configuration bit. When the chip comes out of reset, it can read one bit per pin and configure the functions of the chip accordingly. By way of example, graphics processor units may use configuration bits to identify a display connector type that the GPU is connected with, the configuration bits can set default modes, set memory operation size and can be used to boot up transceiver driver settings and provide other configuration functionality.

It is also known to use dedicated configuration ports for an integrated circuit so the integrated circuit does not need to reuse the GPIO pins as configuration ports. However, each port only provides a single bit of configuration information.

Accordingly, a need exists for an improved method and apparatus for configuring an integrated circuit.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF THE PREFERRED EMBODIMENTS

Briefly, a method and apparatus configures an integrated circuit by determining a multi-bit configuration value on a single node. The multi-bit configuration value is determined by using at least a voltage level at the single node and also by detecting a time to reach a voltage threshold level at the single node, based on a voltage ramp generation circuit. The method and apparatus also includes configuring an operation mode of a circuit in the integrated circuit based on the determined multi-bit configuration value from the single node. Multi-bit configuration values may be obtained on multiple single nodes in an integrated circuit. In one example, a voltage level is employed in addition to a time to reach a voltage threshold level whereas in another example a current level on a single node is utilized in combination with detection of a time to reach a voltage threshold level. In one example, the multi-bit single node multi-bit configuration value is generated prior to the integrated circuit coming out of a reset mode.

Among other advantages, a single node is used to provide a plurality of configuration bits thereby reducing the number of pins required on a chip to configure an integrated circuit. In addition, general purpose input/output pins are also not needed if desired. Benefits can include a reduction in the size of the integrated circuit die compared to other known systems that employ a single bit per pin structure to provide a single configuration bit per I/O line or per pin or pad.

In one example, the method and apparatus determines the multi-bit configuration value on a single node prior to the integrated circuit coming out of a reset mode and also detects the voltage level based on a resistor divider circuit. The method and apparatus may determine at least a first configuration bit or plurality of configuration bits at a single node based on the voltage level and at least a second configuration bit or set of configuration bits at the single node based on a resistor capacitor network (RC network). For example, the RC network may serve as the voltage ramp generation circuit. The most significant bits of the plurality of configuration bits may be generated using a resistor divider and its corresponding voltage level whereas the least significant bits of a plurality of configuration bits may be generated using the time to reach a voltage threshold level based on the RC network.

In one example, an independent clock source, such as a ring oscillator, may be employed so that the configuration detection logic can suitably be clocked to switch between a mode that employs the resistor divider and hence voltage level at the single node, and a different mode that detects a time to reach a voltage threshold level at the single node based on the voltage ramp generation circuit. The clock source may be independent of a main clock source of the circuit that is being configured in the IC. Alternatively, a crystal oscillator of the IC may be used as a clock source for the configuration detection logic if desired since a crystal clock source is possibly always on during the reset mode of the integrated circuit.

In one example, the voltage level is determined based on the resistor divider circuit that is external to the integrated circuit and an internal resistor and external capacitor that forms an RC network as part of the voltage ramp generation circuit. As such, the resistor divider circuit may be located off-die from the integrated circuit and a capacitor circuit of the RC network is located off-die from the IC. The configuration detection logic is operative to generate the multi-bit configuration value having a set of most significant bits generated based on the voltage level and a set of least significant bits generated based on the detected time to reach a voltage threshold level.

Figure 1:
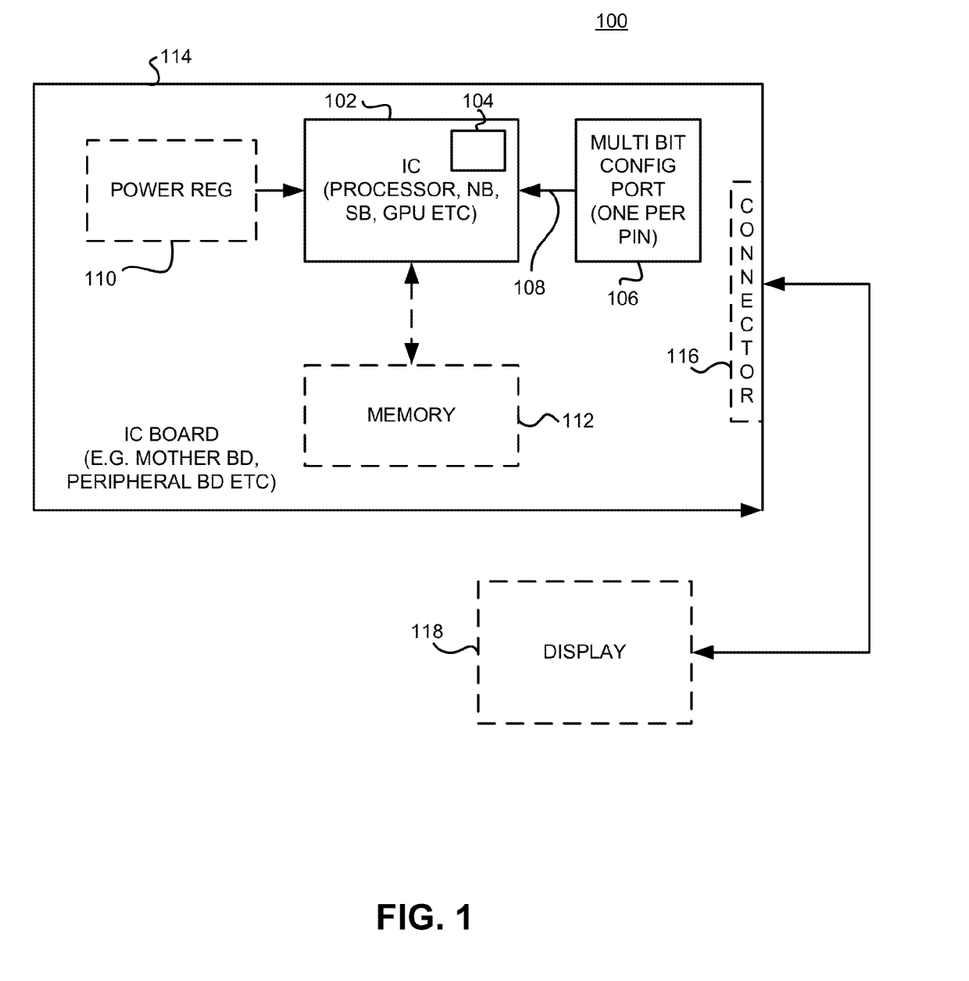
FIG. 1 is a block diagram illustrating one example of an apparatus that employs at least one single node multi-bit configuration port that includes configuration detection logic in accordance with one example set forth in the disclosure.

FIG. 1 is a block diagram illustrating one example of an apparatus 100 that includes an integrated circuit 102 that includes therein one or more configurable circuits 104. The apparatus also includes a multi-bit configuration port 106 that includes configuration detection logic that determines a multi-bit configuration value 108 on a single node by using at least both a voltage level at the single node and also detects a time to reach a voltage threshold level at the single node. The voltage threshold level is compared to voltage level generated using a voltage ramp generation circuit. The integrated circuit 104 then configures an operation mode of the circuit 104 based on the determined multi-bit configuration value 108 from the single node.

In this example, the apparatus may be considered a portable handheld device, laptop computer, smart phone, tablet device, high definition television, printer or any other suitable apparatus. By way of illustrating and not limitation, the apparatus may include a power source which in this example is shown to be a power regulator 110 that provides power to the integrated circuit 102. The apparatus may include memory 112 accessible by the integrated circuit 102 to allow the integrated circuit to process and store information. The integrated circuit 102 may be, for example, a CPU, Northbridge, Southbridge, graphics processor unit, any other suitable ASIC or any suitable integrated circuit. In this example, the integrated circuit 102 is shown to be mounted to an integrated circuit board 114 that includes a connector 116 that may be used to connect a display 118 so that the apparatus may display information provided by the integrated circuit. Wireless transceivers and any other suitable circuits may also be employed in the apparatus as desired.

Figure 2:
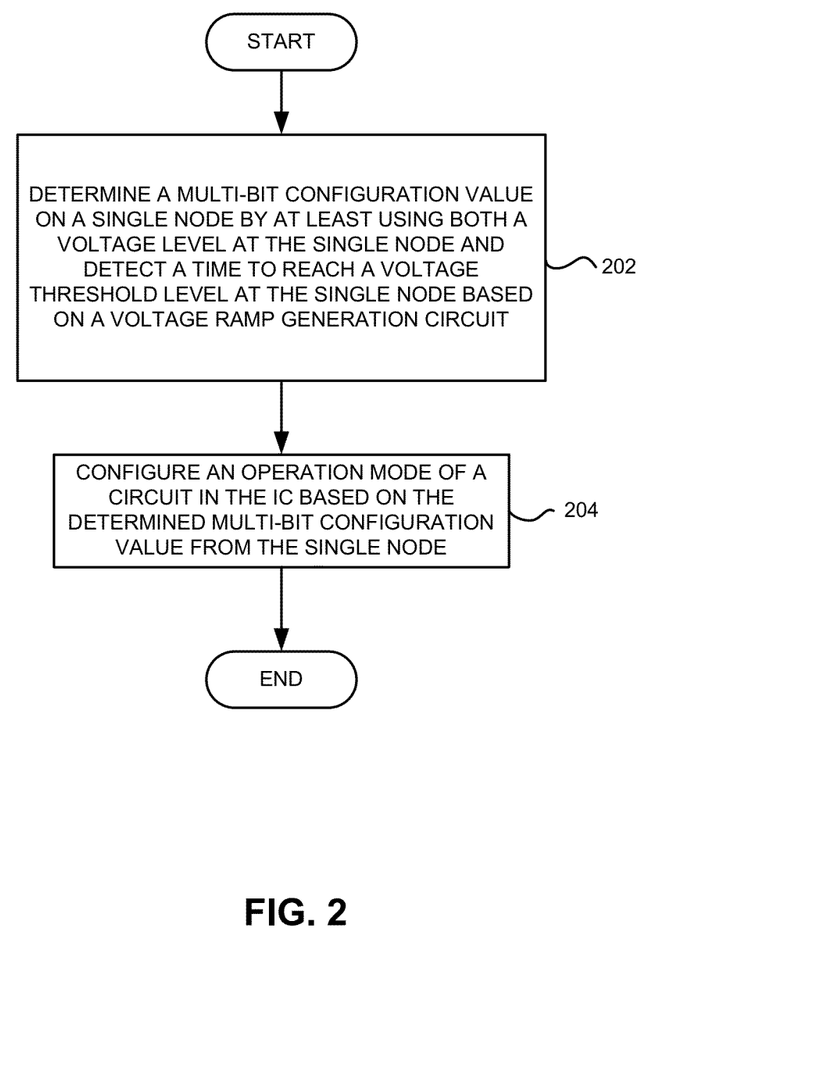
FIG. 2 is a flowchart illustrating one example of a method for configuring an integrated circuit in accordance with one embodiment set forth in the disclosure.
Figure 3:
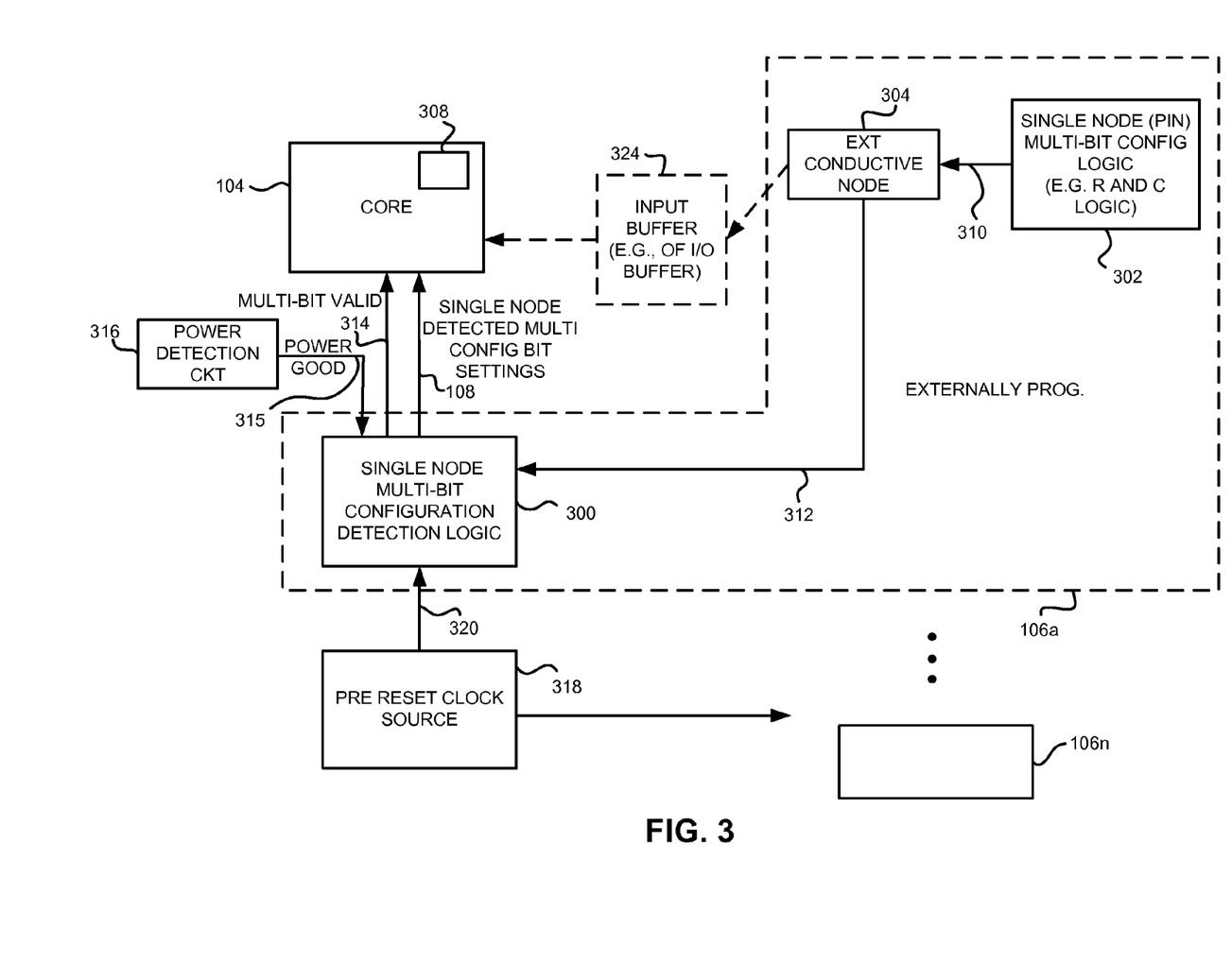
FIG. 3 is a block diagram illustrating one example of configuration detection logic to determine a multi-bit configuration value on a single node in accordance with one example set forth in the disclosure.

FIG. 2 is a flowchart illustrating one example of a method for configuring an integrated circuit. Referring also to FIG. 3, FIG. 3 illustrates in more detail one example of the multi-bit configuration port 106 shown in FIG. 1. As shown, a plurality of single node multi-bit configuration ports 106a-106n may be used wherein each is coupled to a corresponding node and each comprise the configuration detection logic and multi-bit configuration logic. The single node multi-bit configuration port 106 includes configuration detection logic 300 and multi-bit configuration logic 302 as well as a conductive node 304 that may be external to the integrated circuit. In this example the single node is also shown as being external to the configurable circuit 104 which is shown to be, for example, core logic. As also shown, core logic may have subsystems therein designated as 308 which may also be configured based on the multi-bit configuration value 108. The conductive node 304 is a single node which may be, for example, a conductive pad made of conductive metals, a pin or other conductive material that may be external to a die if desired. The multi-bit configuration port 106 is externally programmable in this example and as further set forth below, the single node multi-bit configuration logic 302 may include, for example, an off-chip resistor divider circuit as well as a capacitor circuit that is also off-chip or off-die from the integrated circuit. However, it will be recognized that internal circuits may also be employed if desired.

The multi-bit configuration logic 302 is coupled to the single node via a connection line shown as 310. The single node multi-bit configuration detection logic 300 receives and/or monitors the signal on the single node 304. This signal is shown as signal 312 that may have a suitable voltage level or current level. The voltage level or current level may be used by the multi-bit configuration detection logic 300 to provide the multi-configuration bits 108 for configuring the circuit 104. In this example, the multi-bit configuration detection logic 300 also generates a multi-bit valid bit 314 to notify the circuit 104 that all of the multiple configuration bits 108 are valid. The configuration detection logic 300 may also receive a power level indication 315 indicating, for example, that the power level is suitably high enough for normal operation of the configuration detection logic. This can be used, for example, when the integrated circuit is in reset. As known in the art, the power level for a particular circuit needs to be at a proper level to avoid malfunction. A power detection circuit 316, as known in the art may indicate that power is good or at a suitable level via the information 315.

Also shown is a clock source 318 that provides a clock signal 320 to the multi-bit configuration detection logic 300 to allow the multi-bit configuration detection logic to switch between differing modes as well as providing a sampling clock as further described below. The clock source may be a ring oscillator or any other suitable clock source. The clock source 318 in this example is independent of a clock source of the circuit 104 so that its operation can begin prior to the circuit 104 coming out of reset. A crystal oscillator for the integrated circuit may also be used if desired. The configuration detection logic 300 determines the digital value corresponding to different voltage levels on the single node 304 based on the clock signals 320 from the clock source 318.

If desired, input/output buffer logic 324 may also be connected to the single node 304 if desired. The input/output buffer may be used during normal operation after the integrated circuit comes out of reset, and the multi-bit configuration detection logic 300 operates before the integrated circuit comes out of reset. In this manner, the same single node 304 may be used not only for normal input/output buffer circuits to receive signals or provide signals, but the same conductive node may be used to provide multi-bit configuration data during a configuration mode.

As shown in FIG. 2, the method includes as shown in block 202, determining a multi-bit configuration value 108 on a single node 304 by using both a voltage level at the single node 304 and by also detecting a time to reach a voltage threshold level at the single node based on a voltage ramp generation circuit, such as an RC network, or any other suitable ramp generation circuit. As shown in block 204, the method includes configuring an operation mode of a circuit 104 in the integrated circuit 102 based on the determined multi-bit configuration value 108 from the single node 304. This may be done, for example, by configuration logic within the integrated circuit that interprets the multi-bit configuration value 108 and adjusts the settings of the circuit as known in the art to configure the circuit 104 in a suitable manner as dictated by the multi-bit configuration value.

Figure 4:
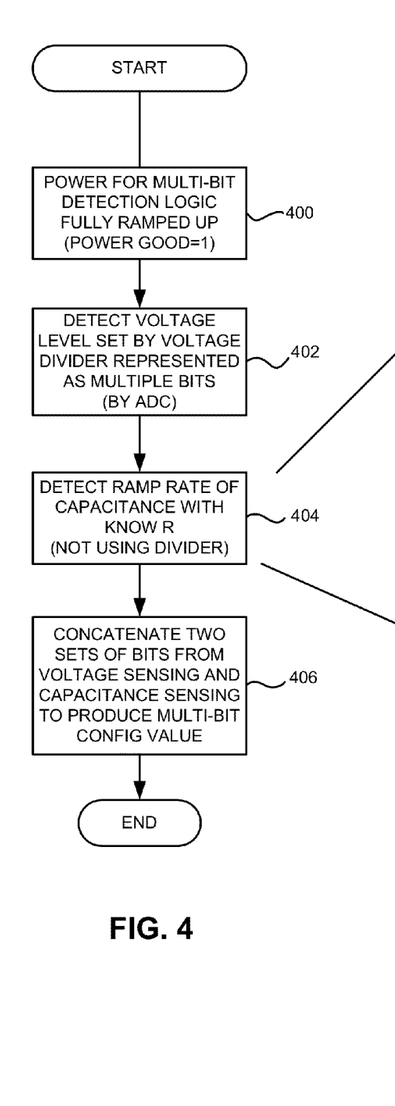
FIG. 4 is a flowchart illustrating one example of a method for configuring an integrated circuit.
Figure 5:
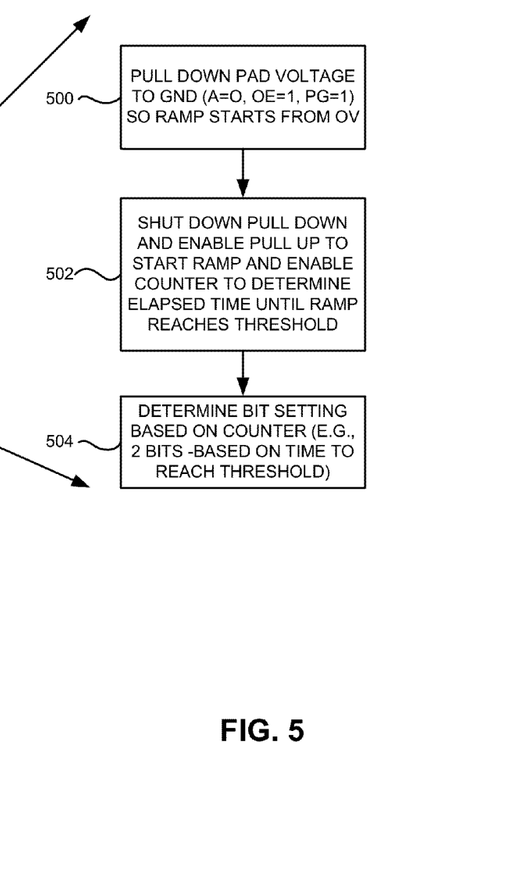
FIG. 5 is a flowchart illustrating in more detail one of the operations set forth in FIG. 4.
Figure 6:
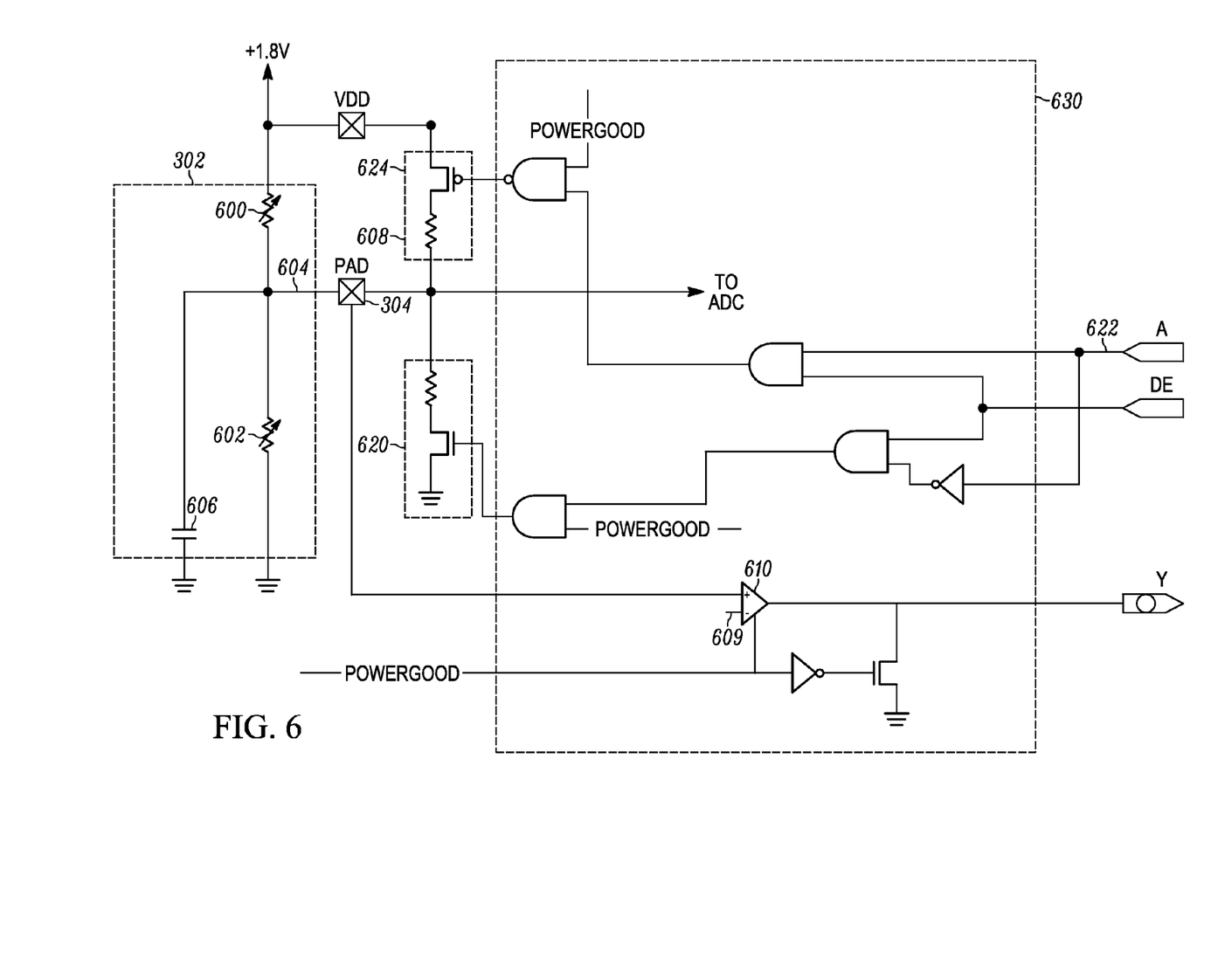
FIG. 6 is a circuit diagram illustrating one example of circuitry employed as part of configuration detection logic and multi-bit configuration logic in accordance with one example set forth in the disclosure.

Referring to FIGS. 4, 5 and 6, the operation of the single node multi-bit configuration port will be described further. The configuration detection logic 300 and multi-bit configuration logic 302 are used to combine two methods to determine separate bits of a configuration strap on the same pin (e.g., node) thereby extending the number of bits achievable per pin. In one example, a first method utilizes a voltage level or bias achieved by an external resistor divider shown in FIG. 6 as resistors 600 and 602. The voltage level 604 produced by the resistor divider network 600 and 602 is used as the first configurable variable by the configuration detection logic 300 to generate, for example, the most significant bits of a multi-bit configuration value 108. An external capacitor 606 in conjunction with a resistor 608 form an RC network which is used in a second mode as a voltage ramp generation circuit. The clock circuit 318 is used for changing state and accumulating data.

In operation as shown in FIG. 4, the method includes determining 400 that the power level for the multi-bit detection logic 300 is at a suitable level (fully ramped up). This may be done, for example, by the power information 314 which is labeled in diagrams as power good=1. The multi-bit configuration detection logic 300 detects the voltage level 604 in one example using an analog to digital converter 700 in FIG. 7. This is shown in block 402. As such in this example, the multi-bit configuration logic 302 is illustrated in FIG. 6 to include a voltage divider circuit that is comprised of a resistor 600 and resistor 602. The voltage level 604 in this example is read as a 4 bit value. However, any suitable number of bits may be employed. As such, during the voltage level detection mode, a first set of configuration bits at the single node are determined based on the voltage level 604 using the analog to digital converter 700.

Figure 7:
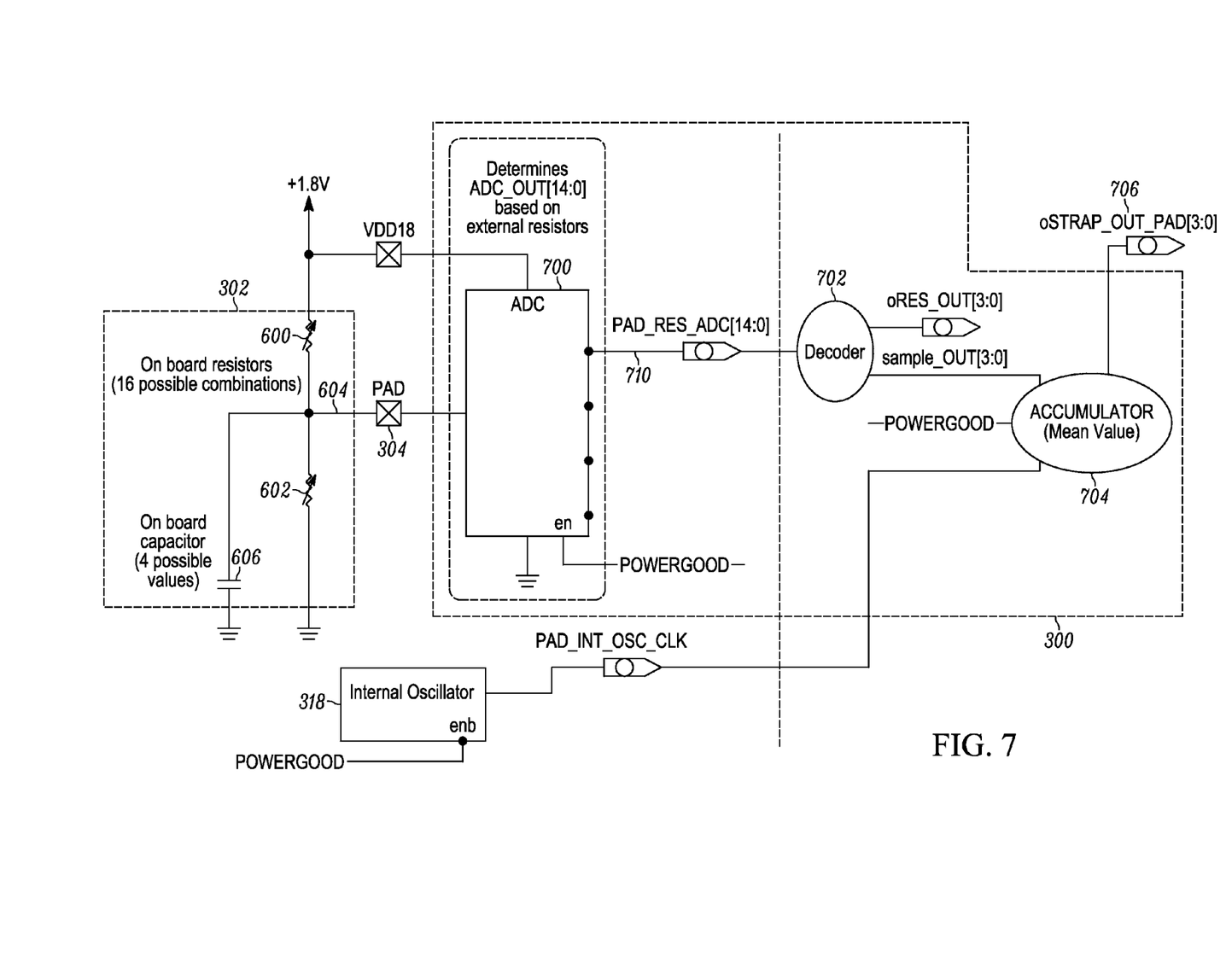
FIG. 7 is a circuit diagram illustrating one example of circuitry employed as part of configuration detection logic and multi-bit configuration logic in accordance with one example set forth in the disclosure.

As shown in FIG. 7, a decoder 702 and accumulator 704 are used to accumulate a strap out value 706 which is the first set of configuration bits. As described herein, six straps are generated, four (4 bits) generated using the resistor divider and two bit generated from the voltage ramp generation circuit. Four binary values are determined through the resistor divider 600 and 602 and are thermometer coded. In this example, the ADC will read in the analog voltage created by the resistor divider and give a thermometer code out. However, any suitable digital value can be used.

One example of ADC output (thermometer codes based on analog voltage) in this example there are 15 comparators in the ADC, each one increasing its threshold voltage (voltage in which it switches from a 0 to 1):

| Vpad (V) | R_pu (Ohm) | R_pd (Ohm) | Thermometer Code | Binary value after Decoder |
|---|---|---|---|---|
| 0.1004 | NC | 2000 | 000000000000000 | 0000 |
| 0.1988 | 16200 | 2000 | 000000000000001 | 0001 |
| 0.3005 | 10000 | 2000 | 000000000000011 | 0010 |
| 0.4012 | 6980 | 2000 | 000000000000111 | 0011 |
| 0.4993 | 5200 | 2000 | 000000000001111 | 0100 |
| 0.5992 | 4020 | 2000 | 000000000011111 | 0101 |
| 0.6984 | 7870 | 4990 | 000000000111111 | 0110 |
| 0.8034 | 6190 | 4990 | 000000001111111 | 0111 |
| 0.9000 | 4990 | 4990 | 000000011111111 | 1000 |
| 0.9969 | 4020 | 4990 | 000000111111111 | 1001 |
| 1.1021 | 3160 | 4990 | 000001111111111 | 1010 |
| 1.2008 | 2490 | 4990 | 000011111111111 | 1011 |
| 1.3017 | 3830 | 10000 | 000111111111111 | 1100 |
| 1.3991 | 2870 | 10000 | 001111111111111 | 1101 |
| 1.4995 | 2000 | 10000 | 011111111111111 | 1110 |
| 1.6014 | 2000 | NC | 111111111111111 | 1111 |

The Accumulator, samples these binary values 32000 times and takes the average (in case of any noise on the power rail). Differing expected resistor divider values are provided as a programming guide to the system configurator. This is but one example, any suitable values may be used as well as any suitable voltage level detection scheme.

Two binary strap values (2bits) are determined in a different mode after the voltage divider has been used, wherein the capacitor 606 and resistor 608 are controlled as a voltage ramp generation circuit. Two binary strap values are used based on the amount of time it takes to charge the capacitor 606 compared to a set threshold. The set threshold is illustrated, for example, in FIG. 6 as threshold 609 in comparator 610.

As such, as shown in block 404, the method includes detecting for example, a time to reach a voltage threshold level at the single node based on the voltage ramp generation circuit. As mentioned, this may result for example in one embodiment in a two bit value. The four bits and two bits are then concatenated as shown in block 406 to form the multi-bit configuration value which is generated from voltage sensing and capacitance sensing as noted above to produce the multi-bit configuration value.

Referring back to FIG. 7, the determining of the voltage level generated by the resistor divider will be described. As shown, when the power good is equal to a logic "1", it indicates that the powers are safe to use for the configuration detection logic. Power good equal to "0" will keep the counters in reset and keep the configuration detection logic in its initial state. The configuration detection logic may include any suitable state machines to suitably control the circuits as desired. The assertion of the power good signal to one also allows time for the RC to settle. Once power good is asserted, the configuration detection logic waits a number of clock cycles and then starts sampling the ADC output 710 via the decoder 702. The accumulator 704 is then used to average the samples taken to determine the first four bit values. To account for regulator noise and if used, a low pass filter at the pad input created by the external resistor divider 600 and 602 and the capacitor 606, the average of the samples is taken. After the first four bits from the resistor divider mode and hence from the analog to digital converter are latched, the configuration detection logic may wait, for example, ten seconds or any other suitable time and then start to discharge the capacitor 606 through pull down circuit 620. Control logic 630 is used to control the pull up and pull down circuits 624 and 620 and also provide the voltage from the ramp generation circuit to allow capture of the ramp threshold crossing indicator signal shown as Y to be sampled by timer control logic 810. Delay circuit 812 provides suitable delay for indicating the straps have been latched. The number of delay elements may be determined based on the longest delay required for capacitor detection plus subsequence logic delays.

Figure 8:
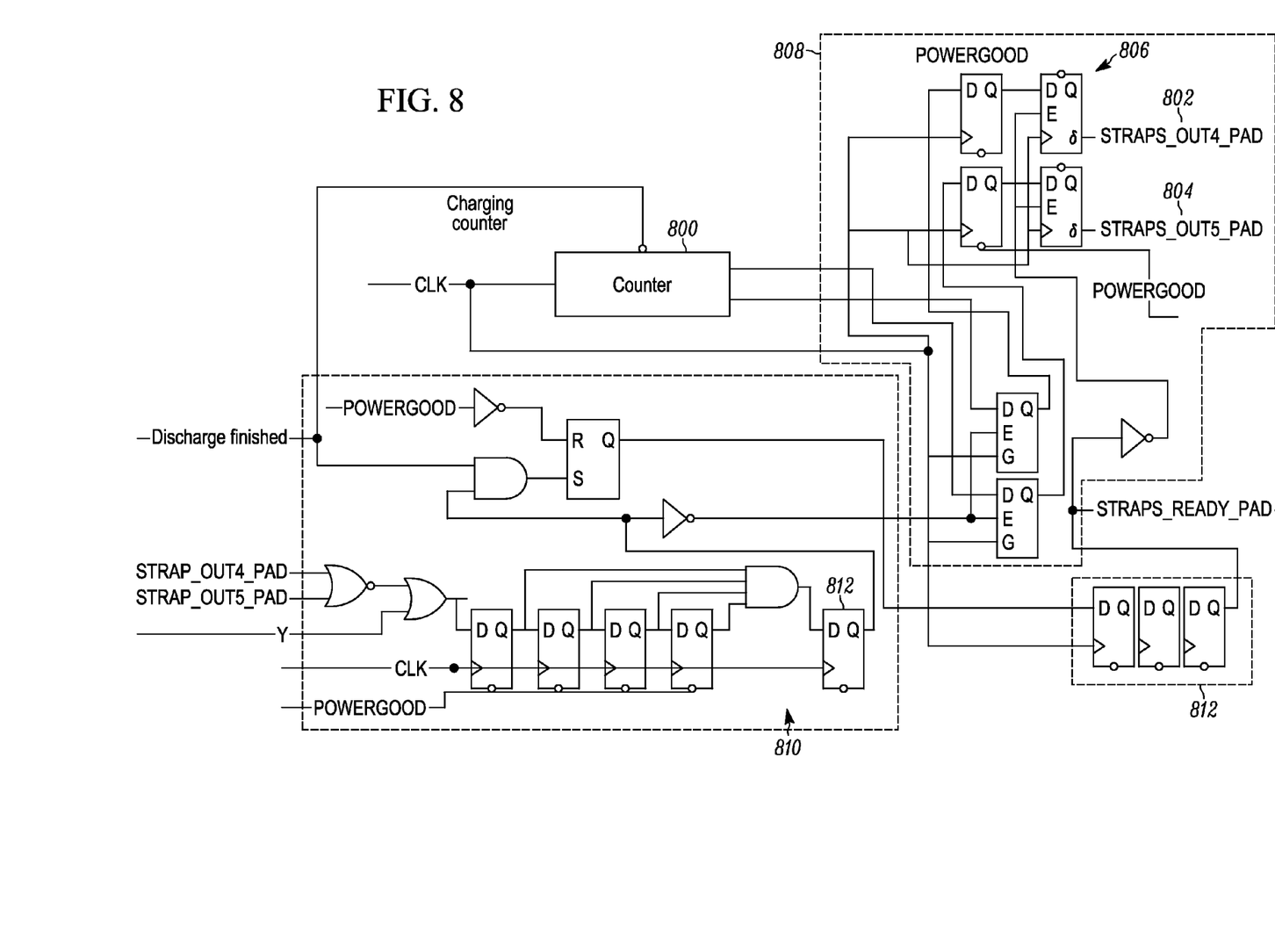
FIG. 8 is a circuit diagram illustrating one example of portions of configuration detection logic in accordance with one embodiment set forth in the disclosure.
Figure 10:
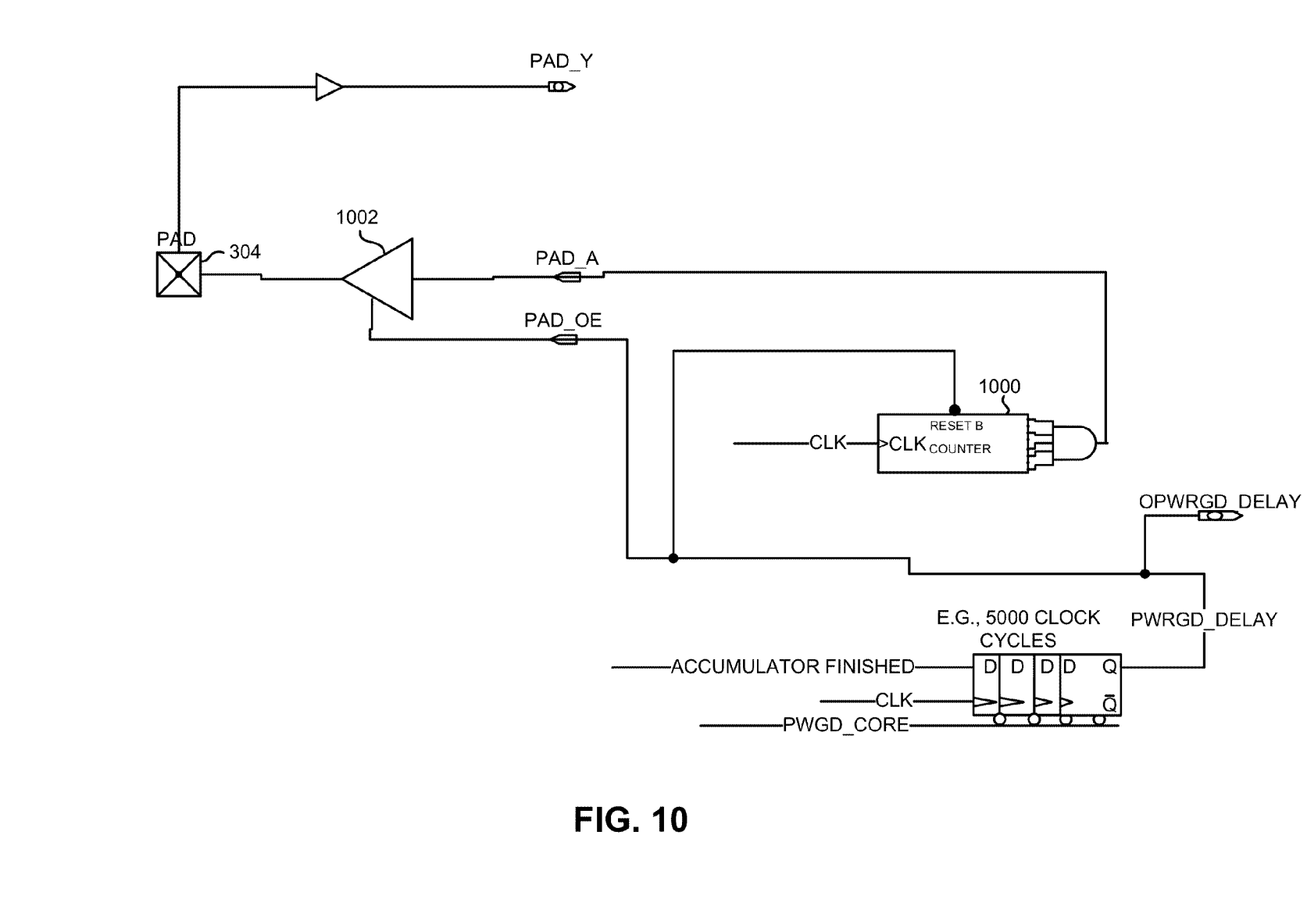
FIG. 10 is a circuit diagram illustrating one example of portions of configuration detection logic in accordance with one embodiment set forth in the disclosure.

After discharging the capacitor 606 this may be done for a long period of time so that a steady state condition is reached. It is assumed that the largest possible value of capacitor has been placed on the circuit and that the external resistors or resistor dividers had the highest possible voltage potential. A counter is used to control the value of A for charging and discharging as shown as 622. After this period of time, the configuration detection logic will begin to charge the capacitor 606 through charging circuit 624. At this time, the "charging" counter is brought out of reset. The charging counter is shown in FIG. 8 as counter 800. The above operations are shown in FIG. 5. As shown in block 500, the method includes pulling down the pad voltage to ground and the logic values for A, OE and PG are shown, so the ramping on the voltage for single node 304 is done from what is believed to be a steady state level. As shown in block 502, the method includes shutting down the pull down circuit 620 and enabling the pull up circuit 624 to start ramping and hence charging the circuit to enable the charging counter 800 to determine the elapsed time until the ramp reaches the threshold 609. Threshold detection is done by comparator 610 in FIG. 6, and the threshold is set and applied on the "-" terminal of the comparator. As shown in block 504, the method includes determining the bit setting caused for the multi-bit configuration that based on the counter value 800 which is stopped when a threshold value is reached. The threshold value may be predetermined. For example, two bits may be based on a time to reach the threshold as the capacitor charges. The output bits are shown as bits 802 and 804 coming from latch circuit 806. This is shown in FIG. 10, for example. The counter 1000 outputs a PAD_A control signal to buffer 1002 which is connected to the pad such that if power is good and the accumulator is finished (after the first four straps are complete), the pad is driven low such that A=0, and OE=1. After a period of time set for example based on the largest expected capacitor to discharge completely, the pad is then driven high charging the capacitor such that A=1 and OE=1. Also when OE=0, the pad will be in a tri-state mode.

Initially, STRAP_OUT_PAD [5:4]=11 and STRAP_READY_PAD=0. STRAP_READY_PAD tells the core logic that all straps have been acquired. This is the multi-bit valid information 314. The capacitor continues to charge until the voltage at the pad reaches the predetermined threshold. At this point, the counter is stopped and the counter value is decoded to the appropriate strap values by the decoding logic internal to counter 800. To decode, a look up table, or other method may be sued, to translate the counter output result to a corresponding capacitor value.

By way of example only, below are counts based on expected capacitor and expected ring oscillator variations.

|  | 000.000E+0 | 10 nF | 82 nF | 680 nF |
|---|---|---|---|---|
| Min Count | 0.51 | 31.56 | 256.39 | 1632.05 |
| Max Count | 2.78 | 197.03 | 1603.63 | 12743.70 |
| max-min mid point |  | 18 | 227 | 1618 |

The STRAP_OUT_PAD [5:4] may be fixed several clock cycles later whereas the STRAP_READY_PAD will be asserted for example three clocks later. At this point, the STRAP_OUT [5:4] AND STRAPS_READY will remain fixed as power good remains high.

There are two reasons for this.

(a) When the pad is charged high enough, Y will be set high. This will be asynchronous to the clock. This is to make sure that there is not any meta-stability in the flop at this time.

(b) Also, in changing from 01 to 10 a race condition should be avoided.

Figure 9:
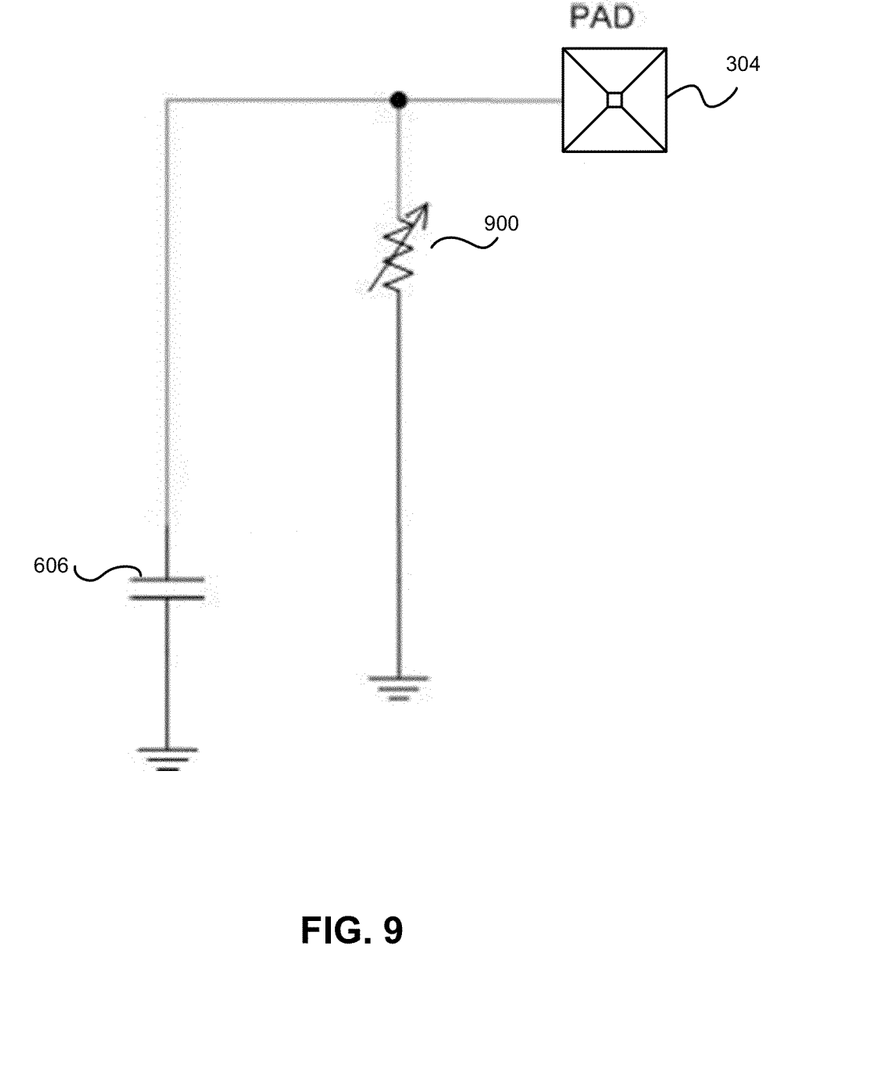
FIG. 9 is a circuit diagram illustrating one example of current based single node multi-bit configuration logic in accordance with one example set forth in the disclosure.

A similar approach can be used instead of using voltage sensing, current sensing may be employed as shown in FIG. 9 wherein an external resistor 900 to ground is used. In this example, the current is measured instead of a voltage potential setup by the voltage dividers in order to receive the first set of straps.

Also, integrated circuit design systems (e.g., work stations including, as known in the art, one or more processors, associated memory in communication via one or more buses or other suitable interconnect and other known peripherals) are known that create wafers with integrated circuits based on executable instructions stored on a computer readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic and circuits described herein may also be produced as integrated circuits by such systems using the computer readable medium with instructions stored therein. For example, an integrated circuit with the aforedescribed logic and structure may be created using such integrated circuit fabrication systems. In such a system, the computer readable medium stores instructions executable by one or more integrated circuit design systems that causes the one or more integrated circuit design systems to produce an integrated circuit. The integrated circuit includes logic operative to determine a multi-bit configuration value on a single node by at least using both a voltage level at the single node and detecting a time to reach a voltage threshold level at the single node based on a voltage ramp generation circuit and wherein the integrated circuit configures an operation mode of the at least one configurable circuit in the IC based on the determined multi-bit configuration value from the single node.

Among other advantages, a single node 304 may be used to generate in this example, six configuration bits, four of which come from a voltage divider circuit and two are the result of a ramp generation circuit and the determination of the amount of time for the voltage ramping to reach a threshold. Accordingly, a single node can be used to provide multi-bits of configuration information. The integrated circuit then uses the single node multi-configuration bit value to configure the suitable circuit as known in the art.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. A method for configuring an integrated circuit (IC) comprising:

determining a multi-bit configuration value on a single node by at least using both a voltage level at the single node and detecting a time to reach a voltage threshold level at the single node based on a voltage ramp generation circuit; and configuring an operation mode of a circuit in the IC based on the determined multi-bit configuration value from the single node.

2. The method of claim 1 comprising determining the multi-bit configuration value on the single node prior to the IC coming out of a reset mode and detecting the voltage level based on resistor divider circuit.

3. The method of claim 2 comprising determining a plurality of configuration bits based on converting an analog voltage to digital value obtained from the resistor divider and determining a plurality of configuration bits based on a threshold voltage and a time determined to charge the capacitor circuit of the RC network, prior to the IC coming out of reset.

4. The method of claim 3 comprising:
providing a clock source independent of a clock source of the circuit in the IC.

5. The method of claim 1 comprising determining at least a first configuration bit at the single node based on the voltage level and at least a second configuration bit at the single node based on an RC network.

6. A method for configuring an integrated circuit (IC) comprising:
determining a multi-bit configuration value on a single node by at least using both a current level at the single node and detecting a time to reach a voltage threshold level at the single node based on a time to reach a voltage threshold level generator circuit; and
configuring an operation mode of a circuit in the IC based on the determined multi-bit configuration value from the single node.

7. The method of claim 6 comprising determining the multi-bit configuration value on the single node prior to the IC coming out of a reset mode and detecting the current level based on current sink circuit.

8. The method of claim 6 comprising determining at least a first configuration bit at the single node based on the current level and at least a second configuration bit at the single node based in a RC network.

9. An apparatus comprising:
an integrated circuit that comprises:
at least one configurable circuit; and
at least one single node multi-bit configuration port that comprises configuration detection logic operative to determine a multi-bit configuration value on a single node by at least using both a voltage level at the single node and detecting a time to reach a voltage threshold level at the single node based on a voltage ramp generation circuit; and wherein the integrated circuit configures an operation mode of the at least one configurable circuit in the IC based on the determined multi-bit configuration value from the single node.

10. The apparatus of claim 9 comprising:
multi-bit configuration logic, operatively coupled to the single node, comprising a voltage divider circuit and the time to reach a voltage threshold level generation circuit, and wherein the time to reach a voltage threshold level generation circuit comprises a resistor capacitor (RC) network; and
wherein the configuration detection logic is operative to determine the multi-bit configuration value prior to the IC coming out of a reset mode.

11. The apparatus of claim 10 wherein the voltage divider circuit is located off die from the integrated circuit and wherein a capacitor circuit of the RC network is located off die from the IC and wherein the configuration detection logic is operative to generate the multi-bit configuration value having a set of most significant bits generated based on the voltage level and a set of least significant bits generated based on the detected time to reach a voltage threshold level.

12. The apparatus of claim 9 wherein the configuration detection logic is operative to determine at least a first configuration bit at the single node based on the voltage level and at least a second configuration bit at the single node based on a RC network.

13. The apparatus of claim 10 wherein the configuration detection logic comprises an analog to digital converter circuit and is operative to determine a plurality of configuration bits based on converting an analog voltage to digital value obtained from the voltage divider circuit and logic operative to determine a plurality of configuration bits based on converting an analog voltage to digital voltage obtained based on a threshold voltage and a time determined to charge the capacitor circuit of the RC network, prior to the IC coming out of reset.

14. The apparatus of claim 13 comprising a clock source independent of a clock source of the circuit in the IC wherein the configuration detection logic is operative to select different voltage levels corresponding to different bits of the plurality of configuration bits on the single node based on the clock signals from the clock source.

15. The apparatus of claim 9 comprising input/output logic coupled to the single node.

16. The apparatus of claim 9 comprising a display operatively coupled to the integrated circuit.

17. The apparatus of claim 9 comprising a plurality of single node multi-bit configuration ports, each coupled to a corresponding node and that each comprise configuration detection logic operative to determine a multi-bit configuration value on a respective single node by at least using both a voltage level at the single node and detecting a time to reach a voltage threshold level at the single node based on a time to reach a voltage threshold level generation circuit; and configure an operation mode of a circuit in the IC based on the determined multi-bit configuration value from the single node.

18. A non-transitory computer readable storage medium comprising executable instructions that when executed cause an integrated circuit fabrication system to produce an integrated circuit comprising:
at least one single node multi-bit configuration port that comprises configuration detection logic operative to determine a multi-bit configuration value on a single node by at least using both a voltage level at the single node and detecting a time to reach a voltage threshold level at the single node based on a voltage threshold level generation circuit; and
configure an operation mode of a circuit in the IC based on the determined multi-bit configuration value from the single node.

19. The computer readable medium of claim 18 comprising executable instructions that when executed cause an integrated circuit fabrication system to produce an integrated circuit wherein the configuration detection logic is operative to determine at least a first configuration bit at the single node based on the voltage level and at least a second configuration bit at the single node based on the time to reach a voltage threshold level from a time to reach a voltage threshold level generation circuit.

20. The apparatus of claim 18 comprising executable instructions that when executed cause an integrated circuit fabrication system to produce an integrated circuit wherein the configuration detection logic comprises an analog to digital converter circuit and is operative to determine a plurality of configuration bits based on converting an analog voltage to digital voltage obtained from the voltage level at the single node and determining a plurality of configuration bits based on converting an analog voltage to digital voltage obtained based on a threshold voltage and a time determined to charge a capacitor circuit of an resistor capacitor network, prior to the IC coming out of reset.

* * * * *